United States Patent [19]

Tasch, Jr.

[11] 4,164,751
[45] Aug. 14, 1979

[54] HIGH CAPACITY DYNAMIC RAM CELL

[75] Inventor: Aloysious F. Tasch, Jr., Richardson, Tex.

[73] Assignee: Texas Instruments Incorporated, Dallas, Tex.

[21] Appl. No.: 740,528

[22] Filed: Nov. 10, 1976

[51] Int. Cl.² .................. H01L 27/04; G11C 11/24
[52] U.S. Cl. .............................. 357/41; 357/24; 357/91; 365/149; 365/178; 365/186
[58] Field of Search .................. 357/24, 23, 41, 91, 357/307; 307/238; 365/149, 178, 182, 186

[56] References Cited

U.S. PATENT DOCUMENTS

| | | | |
|---|---|---|---|
| 3,740,732 | 6/1973 | Frandon | 357/24 |
| 3,852,800 | 12/1974 | Ohwada et al. | 357/24 |
| 3,996,655 | 12/1976 | Cunningham et al. | 357/41 |
| 4,003,036 | 1/1977 | Jenne | 357/23 |
| 4,012,757 | 3/1977 | Koo | 357/24 |
| 4,060,738 | 11/1977 | Tasch, Jr. et al. | 357/24 |

OTHER PUBLICATIONS

Mueller et al., "Ion Implantation," *RCA Engineer*, Aug. 1972, pp. 116–119.
Abbas et al., "Memory Cell Structure," IBM Tech. Discl. Bulletin, vol. 18, No. 10, Mar. 1976, p. 3288.

*Primary Examiner*—William D. Larkins
*Attorney, Agent, or Firm*—Melvin Sharp; Richard L. Donaldson; William E. Hiller

[57] ABSTRACT

Disclosed is a memory system capable of being integrated into a semiconductor substrate and having an array of Hi-C memory cells. The Hi-C cells are selectively addressable by row and column lines. Each cell of the array is comprised of a transistor having a source coupled to a bit line, a gate coupled to a word line, and a drain coupled to a node N. Node N is coupled in parallel to a dielectric capacitor and to a depletion capacitor. The dielectric capacitor and the depletion capacitor are constructed to have substantially the same charge capacity.

2 Claims, 26 Drawing Figures

STORAGE REGION
TRANSFER REGION
BIT LINE
BINARY "0"
BINARY "1"   BINARY "1"

BINARY "0"

STORAGE REGION
TRANSFER REGION
BIT LINE
BINARY "0"
BINARY "1"

BINARY "1"

HIGH CAPACITY DYNAMIC RAM CELL

BACKGROUND OF THE INVENTION

This invention relates to semiconductor memories, and more particularly to binary random access memories (RAM) having an array of improved memory cells.

During the past several years, much time, effort, and money has gone into the development of high density, low cost memories. This is because the computer industry has continually demanded more and more storage capacity. As a result of this past memory development work, the number of bits of storage per chip has increased from 16 to 16,000. In addition, the cost per bit has been decreased by a factor of approximately 200.

A major reason for this progress has been the development of small, reliable memory cells. Thousands of these cells are formed on a single chip; and the chips are interconnected to form larger memories. The cost in the production of semiconductor chips is such that most of the expense is in bonding, packaging, testing, handling, and the like, rather than in the cost of the small chip of silicon which contains the actual circuitry. Thus, any circuit which can be contained within a chip of a given size, for example, 30,000 square mils, will cost about the same as any other. By forming large numbers of memory cells in a chip, large economies in the cost per bit can result if reasonable yields are obtained. However, as the size of a chip increases, the yield decreases; so that the advantages of larger chip sizes are outweighed by reduction in yield. Presently, chips of about 150–250 mils on a side are commonly made in the semiconductor industry. Accordingly, it is desirable to reduce the area occupied by each cell in a RAM.

Three types of cells are currently used in the construction of semiconductor memory chips. These memory cell types are called the one transistor cell (1-T cell), the double level polysilicon cell (DLP cell), and the charge coupled cell (CC cell). The two former cell types are described in U.S. Pat. No. 3,387,286 by R. H. Dennard and U.S. Pat. No. 3,720,922 by W. F. Kosonocky, respectively. The CC RAM cell is described in copending application Ser. No. 554,889 filed Mar. 3, 1975 by A. Tasch, Jr. et al, abandoned in favor of continuation application Ser. No. 739,758 filed Nov. 8, 1976, now U.S. Pat. No. 4,060,738 issued Nov. 29, 1977.

As alluded to earlier, the 1-T cell, the DLP cell, and the CC cell each are the product of many years of work and refinement. Thus, it could be expected that large improvements in such a developed field are unlikely. However, the present invention includes a novel cell—termed a "Hi-C" cell—which has several significant advantages over the prior art.

One important limitation of the 1-T, DLP, and CC cells is that they all have less charge capacity per unit area than is desirable. A high charge capacity per unit area is desired because as the number of bits per chip increases, the size of each cell must necessarily decrease. Thus the amount of charge that can be stored in each cell decreases. And eventually, a point is reached beyond which the cell cannot be reduced further because the amount of charge that the cell can store is indistinguishable from noise. Thus, charge capacity per unit area is a fundamental limitation on the minimum cell size.

The 1-T and DLP cells are also deficient in a second parameter—which is called leakage current. The leakage current is a measure of the quantity of electron-hole pairs that are thermally generated in a cell. These charge carriers are undesirable because they alter the amount of charge that is stored as information, and eventually they totally cancel the information charge. In order to avoid this cancelling effect, the information charge in the cell must be periodically refreshed at certain minimum intervals. The refresh period is inversely proportional to the leakage current in the cell. It is an experimentally verified fact that leakage current in the 1-T and DLP cells is typically 3 to 8 times greater than that of the CC cell. But on the other hand, charge capacity of the CC cell is only approximately half the charge capacity of the 1-T or DLP cells. Thus, no single cell type has the best of both parameters.

Because of these and other limitations in the prior art, and because of the demand for more bits of storage per chip, it is therefore one object of the invention to provide a memory having an improved memory cell.

It is another object of the invention to provide a memory cell having an increased storage capacity per unit area.

It is still another object of the invention to provide a memory cell having low leakage current while at the same time having increased storage capacity per unit area.

SUMMARY OF THE INVENTION

These and other objectives are accomplished in accordance with the invention by a memory system of the type having an array of Hi-C memory cells selectively addressed by row and column lines. In one particular embodiment each of the Hi-C cells of the array is comprised of a P-type semiconductor substrate having a first surface. An N+ region in this first surface forms a bit line and a transistor source. A storage region in the first surface is spaced apart from the N+ region. This storage region is comprised of an N-type implant lying in the substrate near the first surface plus a P-type implant lying in the substrate beneath the N-type implant. The P-type implant has an impurity doping that is greater than the doping of the substrate. An MOS transfer region is formed in the first surface between the N+ region and the storage region. Also, a first insulating layer overlies the first surface. A storage gate region overlies the insulating layer above the storage region; and a transfer gate region overlies the insulating layer above the transfer region. A second insulating layer separates and overlies the storage gate region and the transfer gate region. A row line overlies the second insulating layer and is electrically connected to the transfer gate region by a contact which penetrates the second insulating layer.

Other embodiments of the Hi-C cell are also disclosed; and each of them is usable in a memory system having an array of selectively addressable memory cells. In addition, a high capacity dynamic MOS capacitor is disclosed. This capacitor is suitable for use with other integrated circuitry whenever a high capacitance is required.

BRIEF DESCRIPTION OF THE DRAWINGS

The novel features believed characteristic of the invention are set forth in the appended claims; the invention itself, however, as well as other features and advantages thereof, will best be understood by reference to the following detailed description of particular embodiments, read in conjunction with the accompanying drawings, wherein:

DETAILED DESCRIPTION OF SPECIFIC EMBODIMENTS

Figure 1:
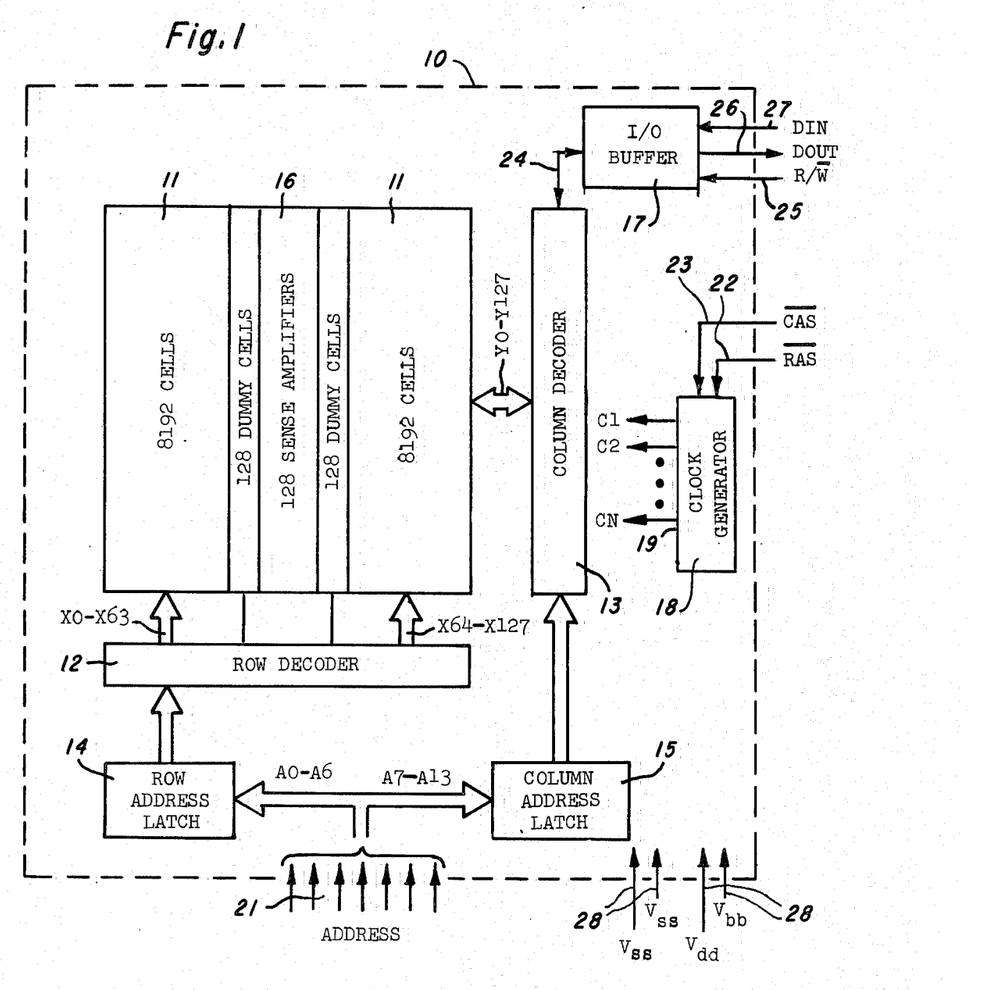
FIG. 1 is a block diagram of an MOS memory chip that incorporates an array of memory cells each having a construction which embodies the invention.

Referring to FIG. 1, one particular MOS memory chip 10 which uses the invention is illustrated in block diagram form. This chip consists basically of an array 11 of Hi-C memory cells, a row decoder 12, a column decoder 13, a row address latch 14, a column address latch 15, a plurality of sense amplifiers 16, an I/O buffer 17, and a clock generator 18. Array 11 occupies the majority of the chip space, and it is comprised of thousands of Hi-C memory cells. The construction of each of these cells embodies the invention.

Array 11 provides storage for binary information and may be of various sizes. The particular array in FIG. 1 contains 16,384 Hi-C memory cells divided into 128 rows and 128 columns. One sense amplifier is coupled to each column of cells. Any one of several previously described sense amplifiers may be used. For details on one acceptable design which utilizes unbalanced cross-coupled MOS-FET inverters, see co-pending application Ser. No. 691,734 filed June 1, 1976, by Kitagawa and White.

Row decoder 12 selects one of the 128 row lines X0–X127 as determined by a row address contained in latch 14. Similarly, column decoder 13 selects one of the 128 column lines Y0–Y127 as determined by a column address contained in latch 15. The row and column addresses are applied to chip 10 by seven address lines 21 on a time share basis. A "Row Address Strobe" or $\overline{RAS}$ input 22 enables row latch 14 to accept the address on lines 21, while a "Column Address Strobe" or $\overline{CAS}$ input 23 enables column latch 15 to accept the address on lines 21.

Data is transferred between an addressed Hi-C cell in array 11 and I/O buffer 17 via one signal line 24. Column lines Y0–Y127 select one cell from the addressed row, and gate the data contained in the cell onto line 24. Clock generator 18 provides clock signals to synchronize this data transfer. Any one of several previously described clock generators may be used. As an example of a usable read clock generator, see co-pending application Ser. No. 716,709 filed Aug. 23, 1976 by Kitagawa and White, now issued as U.S. Pat. No. 4,072,932 on Feb. 7, 1978.

A read/write lead 25 is provided to distinguish if a read or a write operation is to be performed on the addressed cell. In a read operation, data is transferred from lead 24 to a lead 26 by I/O buffer 17. In a write operation, data is generated on a lead 27 by an external source, transferred to lead 24 by I/O buffer 17, and written into the selected cell. This read and write operation is described in greater detail in conjunction with FIGS. 2, 6 and 7.

Voltage leads 28 are provided to enable the circuitry on chip 10 to be energized. Three external voltages are generally used (however two may also be sufficient). These voltages are labeled $V_{dd}$, $V_{ss}$, $V_{bb}$; and they are commonly +12, 0, and −5 volts respectively. Obviously, other voltages may also be used as suitable alternatives.

Figure 2:
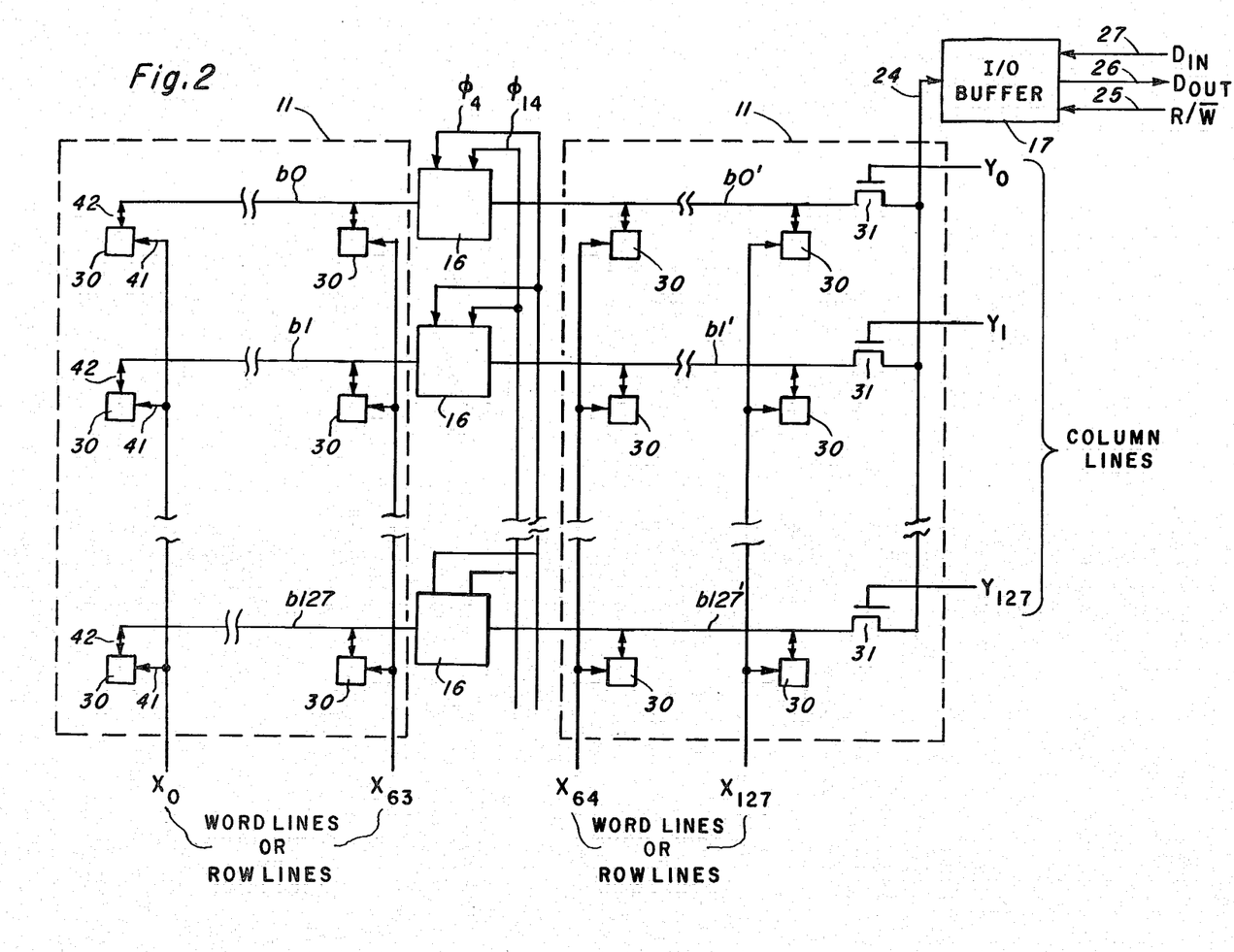
FIG. 2 is a schematic diagram of the memory array of FIG. 1.

Referring now to FIG. 2, a schematic diagram shows array 11 of FIG. 1 in greater detail. This diagram illustrates some of the Hi-C memory cells 30 which make up array 11, and also their interconnections. Each cell has a transfer gate 41 that is used to address the cell. The transfer gate selectively couples to one of the row lines X0–X127. All the cells that are coupled to a particular row line are selected when the voltage on that row line is in one state; and conversely, the same cells are deselected when the voltage on the same row line is in another state. For example, one preferred embodiment of the invention utilizes N-channel memory cells; and in that embodiment, the cells coupled to a particular row line are addressed by raising the voltage on that row line to +12 volts, and the cells are deselected by lowering the same row line voltage to ground.

Each Hi-C cell 30 also has an input-output region 42. This region of the cell couples to one of several bit lines b0–b127 or b0′–b127′. The voltage on bit line pairs b0–b0′, b1–b1′ etc. are generally the complement of each other. The bit lines selectively couple to one of the sense amplifiers 16 and then to signal line 24 through transistors 31. Each column line couples to the gate of a selected one of transistors 31; and therefore, by raising the voltage on one particular column line (in the case of N-channel transistors for example) line 26 will be interconnected to the corresponding bit line.

During the read operation, each of the bit lines is precharged to some voltage that is intermediate to a "1" or "0" level. Then a selection voltage is applied to the addressed row line. In response, all the cells that are coupled to that row line dump the charge they have stored as information onto their corresponding bit line. The sense amplifiers sense this charge, and in response, generate a full "1" or "0" voltage level on the bit lines.

A selection voltage is then applied to one of the column lines; and this gates the "1" or "0" of the corresponding bit line onto signal line 24. This sequence is reversed for a write operation. That is, I/O buffer 17 generates a voltage on signal lead 24. Then a selection voltage is applied to one column line; and this gates the "1" or "0" voltage from lead 24 to the corresponding bit line. Then a selection voltage is applied to one row line. In response, a quantum of charge representing either a "1" or "0" is stored in the selected cell. The physics of how this charge is stored, and the quantum of charge that is stored is of prime concern in this invention; and this is discussed in conjunction with FIGS. 6, 7, 8 and 9.

Figure 3:
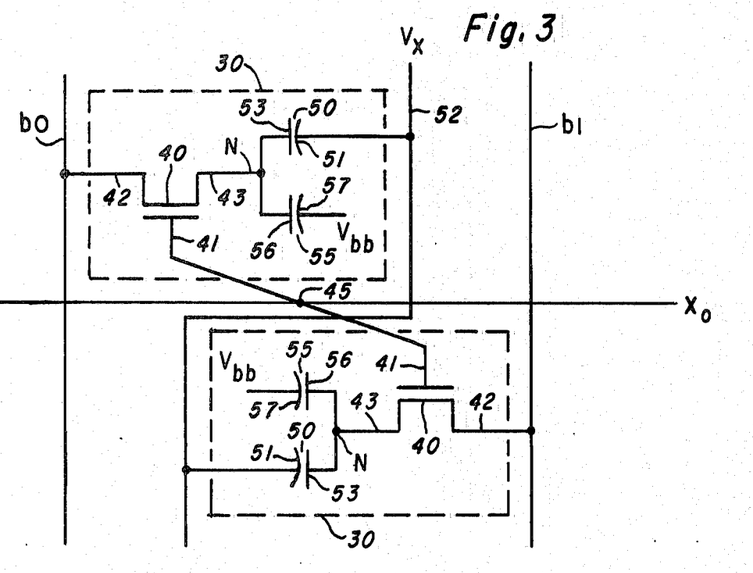
FIG. 3 is a circuit diagram of two memory cells which are contained in the array of FIG. 2.

Referring next to FIG. 3, a circuit diagram of two of the Hi-C memory cells in the array of FIG. 2 is illustrated. In this figure, the labeling on the bit lines is shown as b0, b1; and the row line is shown as X0. Note however, that the circuit diagram for the other memory cells in array 11 is identical to this figure except for the labeling.

The circuit of FIG. 3 is comprised of an insulated gate field effect transistor 40, an oxide capacitor 50, and a depletion capacitor 55. Input/output region 42 of the cell is provided by the source of transistor 40. The drain 43, of transistor 40 couples to a node N; and node N couples to a plate 53 of capacitor 50, and to a plate 56 of capacitor 55. A fixed voltage $V_x$ is applied to a second plate 51 of capacitor 50; while the second plate 57 of capacitor 55 is connected to the substrate bias voltage $V_{bb}$.

Row line X0 couples to the transfer gates 41 of transistors 40. Therefore, by selectively raising or lowering the voltage on the row line, transistors 40 turn on and turn off. When transistor 40 is on, capacitors 50 and 55 charge node N to the voltage level of the bit line; and when transistor 40 is off, the charge in capacitors 50 and 55 remains unchanged. The quantity of charge in capacitors 50 and 55 (the voltage at node N) represents the information stored in the memory cells.

To understand the significance of the Hi-C RAM cell concept it is important to emphasize that the charge in cell 30 is not only stored on oxide capacitor 50, but that it is also stored on depletion capacitor 55. In the past, depletion capacitor 55 has been neglected because for conventional substrate dopings of MOS RAM cells, the depletion capacitance is approximately 10 times smaller than the oxide capacitance. And in the past, nobody had successfully found a way to utilize the depletion capacitance to increase the amount of charge that could be stored in the cell.

The depletion capacitance can be increased by increasing the substrate doping in the region which forms capacitors 50 and 55. For example a P-type implant could be added to a P-type substrate. However, this increased substrate doping also causes the voltage swings which occur at node N to be reduced. And this, in turn, causes the charge capacity of the cell to actually be reduced. This fact has previously been documented. See for example, an article by A. F. Tasch, Jr. in the IEEE Journal of Solid-State Circuits for February 1976.

However, if a shallow implant (at or very near $SiO_2$-Si interface) of conductivity type opposite to the substrate is also added, the flatband voltage in the storage region is shifted in the negative direction. This then allows the potential of node N to maintain its full original swing while at the same time increasing the depletion capacitance. As a result, the charge capacity of the cell may be increased by as much as 100%. This is an important aspect of the Hi-C cell.

Figure 4:
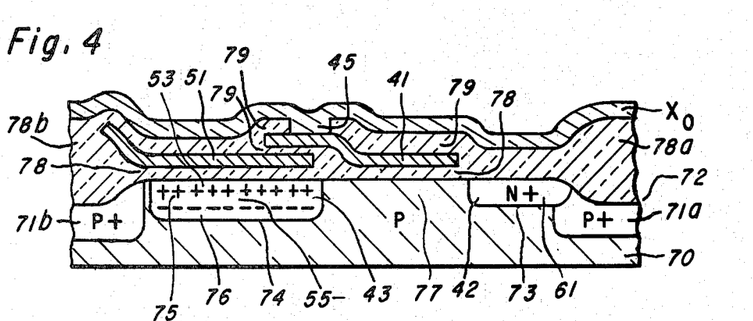
FIG. 4 is a greatly enlarged cross-sectional view of one of the memory cells of FIG. 3.
Figure 5:
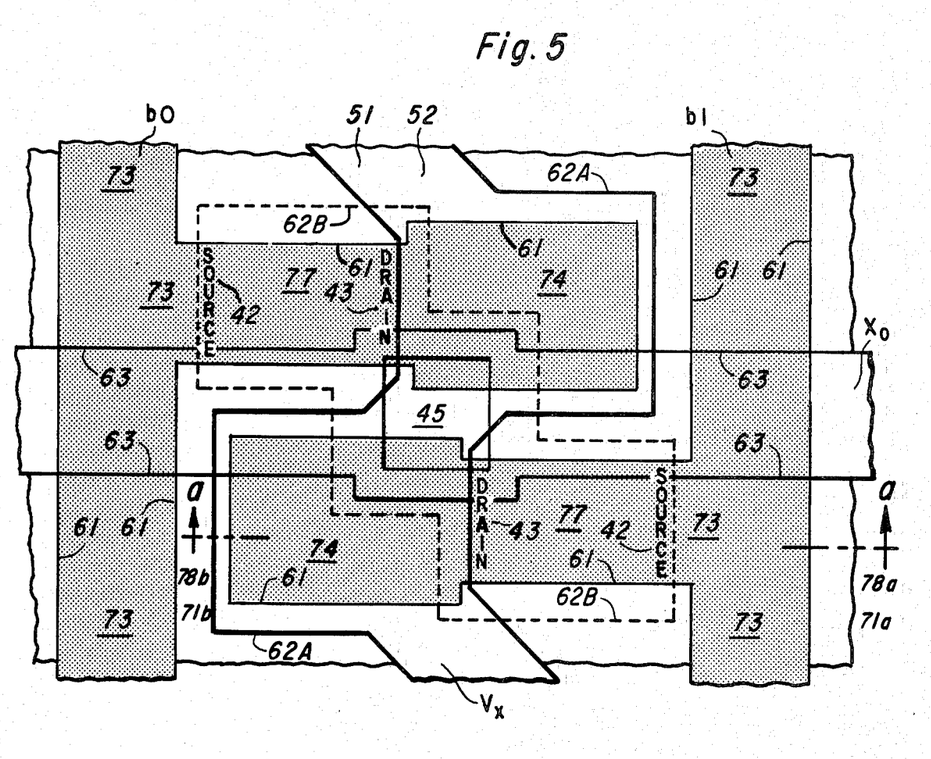
FIG. 5 is a greatly enlarged top view of two of the memory cells of FIG. 3.

Referring next to FIGS. 4 and 5, the detailed physical structure of one preferred embodiment of the Hi-C memory cells is illustrated. In these figures, the actual size of the cell is greatly enlarged. FIG. 4 is a cross-sectional view, taken along line a—a in FIG. 5. This cross-section cuts through one Hi-C memory cell, and exposes all the components of the cell. Implants in the various doped regions are labeled in FIG. 4 for an N-channel cell. However, the structure could easily be modified to provide a P-channel cell as another embodiment.

The Hi-C memory cell is formed by utilizing a P-type semiconductor substrate 70. This substrate has a surface 72 near which several elements of the memory cell are formed. In particular, an N+ region 73 near surface 72 forms bit line b1 and transistor source 42. A storage region 74 is formed by two ion implants 75 and 76 near surface 72. Region 74 forms capacitor 55, plate 53 of capacitor 50, and drain 43. The implants in region 74 are spaced apart from N+ region 73 and overlie each other. Implant 75 is of an N-type material and it lies relatively near surface 72. The other implant 76 of the pair is of a P-type material, and it lies beneath the N-type implant. In the drain 43 area the P implant either coincides with or lies within the N-type implants. This avoids potential barriers to charge flow between storage region 74 and bit line 73. Further structural details of storage implant region 74 will be given following this over-all description of FIGS. 4 and 5.

An MOS transistor region 77 is formed in surface 72 between N+ region 73 and storage region 74 as a result of the substrate being a P-type material. This transfer region is not implanted. An insulating layer 78 overlies substrate surface 72. In one embodiment, insulating layer 78 is formed of $SiO_2$ and is about 1000 Å thick. Storage gate 51 overlies insulating layer 78 above storage region 74; and transfer gate 41 overlies insulating layer 78 above transfer region 77 and partially overlies storage gate 51. Gates 41 and 51 are comprised of a conductive material, such as a polysilicon or a metal for example; and they are about 8000 Å thick.

FIG. 5 is a top view of two Hi-C memory cells that are arranged in accordance with the circuit diagram of FIG. 3, and the cross-sectional view of FIG. 4. The various regions illustrated in FIG. 5 lie on one of three levels as previously described. Components lying on the lowest layer are enclosed by lines 61. These components include the bit lines, b0 and b1, the transistor sources 42, the transistor drains 43, the transfer area 44 between the source and drain regions, and the storage region 74 with the double level implants.

The components lying on the second level are enclosed by lines 62A and 62B. A thin insulating layer, of $SiO_2$ for example, separates the first and second levels. The area enclosed by line 62A forms storage gate 51 and storage line 52. Thus, in this configuration, storage gate 51 and storage line 52 are physically integrated into one area. This area is then connected to a fixed voltage source $V_x$. Similarly, the area enclosed by line 62B forms the transfer gates 41 of transistors 40.

Row line X0 lies on the third level; and it occupies the area enclosed by line 63. The second oxide layer (6000–7000 Å) separates the second and third levels. Electrical connection is made between row line X0 and gates 41 by a contact 45. This contact penetrates the oxide separating the second and third layers.

Of particular importance in this invention are the structural details of storage region 74. There the P-type implant (boron for example) is made to a depth of about 2000 Å–10,000 Å from surface 72; and the N-type implant (arsenic for example) is made to a depth of about 100–500 Å. Note that these implants actually have Gaussian distribution in surface 72 and therefore these numbers define the depth at which the distribution peaks occur.

Boron typically is used as the deeper implant, and the implant operation is performed by an ion-implant machine. This implant may be made into the bare silicon surface 72 before insulating layer 78 is grown. Or alternatively, it can be made directly through insulating layer 78 after the layer is formed. In this latter case, the ion-implant is made at approximately 130 Kev. The dose in the silicon typically ranges from $1-8 \times 10^{12}$ ions/cm$^2$.

The shallow implant typically is arsenic or antimony. Other elements are also acceptable, but these elements are typically used because they have a heavy mass and diffuse slowly. Therefore, they remain at or very near surface 72 during subsequent fabrication steps which are required to form the cell and any associated on-chip circuitry.

Arsenic or antimony can be implanted directly into the bare surface 72 before insulating layer 78 is formed. This process uses an implant energy of approximately 10 Kev. to 50 Kev. Alternatively, these implants can be made after insulating layer 78 is formed. One way to do this is to use a very high implant energy. As an example, approximately 300 Kev. may be required. The high energy is required due to the heavy mass of the ions.

Alternatively, a conveniently lower implant energy can be used which will place most of the dopants within insulating layer 78. The concentration of these dopants is chosen so that the desired amount will subsequently diffuse from insulating layer 78 into surface region 72 during the remaining steps of fabrication. As an example of this approach, arsenic is implanted into 1000 Å of gate oxide at 105 Kev. The dose is typically $1-8 \times 10^{13}$ ions/cm$^2$. The amount of arsenic which subsequently diffuses into surface 72 ranges from $1-6 \times 10^{12}$ ions/cm$^2$. Table 1 (which will be described later) contains experimental data taken from Hi-C cells which were fabricated according to this example.

Figures 6, 6A, 6B, 6C, 6D, 6E, 6F:
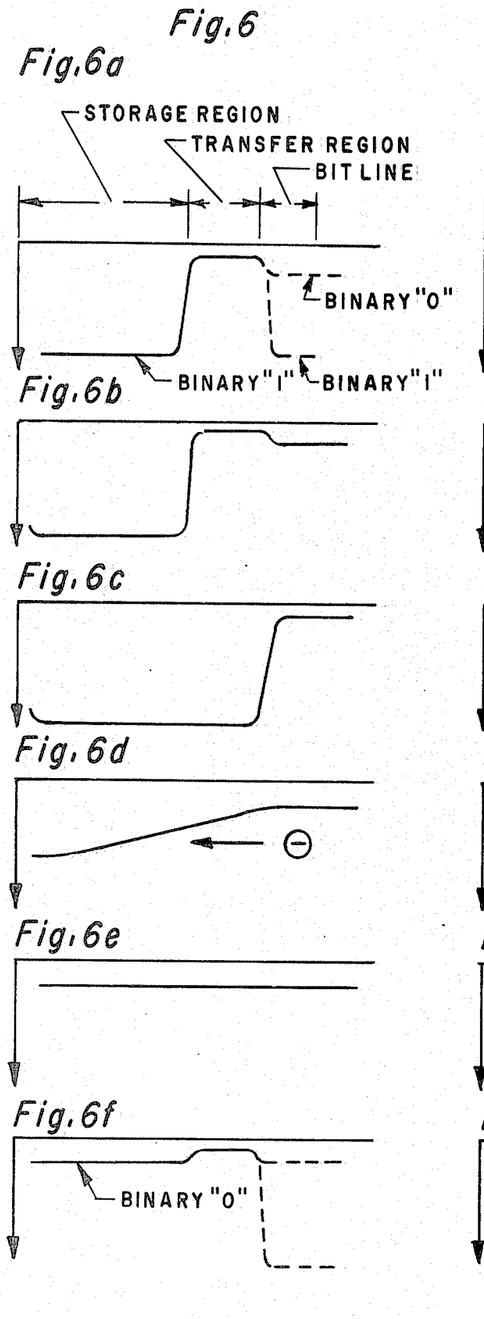
FIGS. 6a–6f are plots of the surface potentials within the memory cell of FIG. 4 that occur at various time instants when a "0" is stored in the cell.
Figures 7, 7A, 7B, 7C, 7D, 7E, 7F:
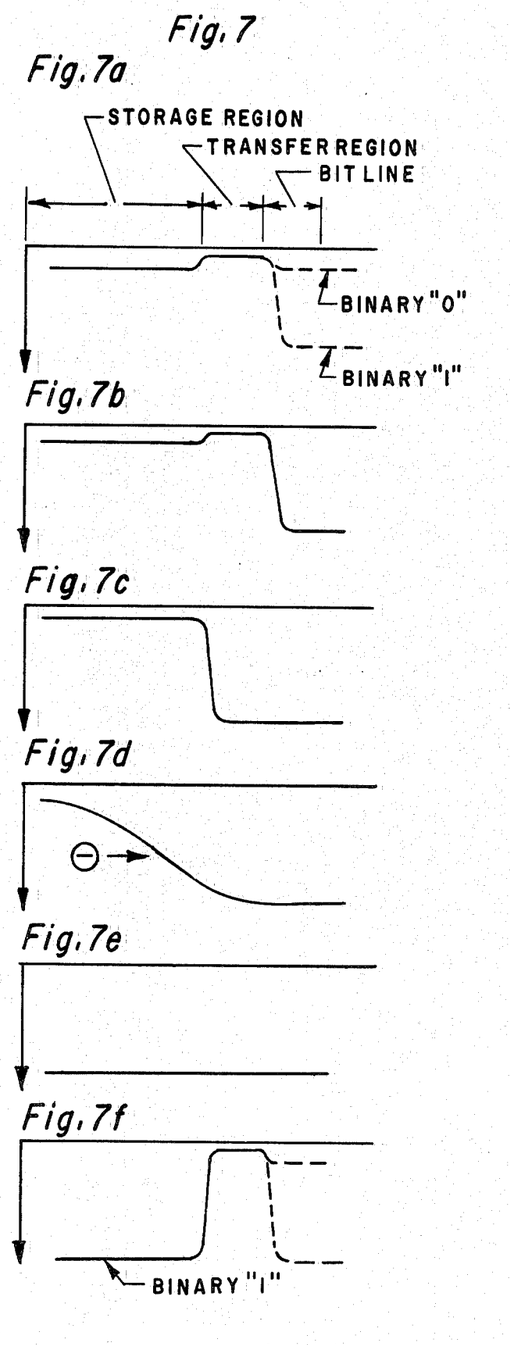
FIGS. 7a–7f are plots of the surface potentials within the memory cell of FIG. 4 that occur at various time instants when a "1" is stored in the cell.

Referring now to FIGS. 6 and 7, the electrical operation of Hi-C memory cell 30 is illustrated. These figures illustrate the surface potentials of storage region 74, transfer region 77, and bit line b1 at sequential time instants. In these figures, surface potential becomes more positive along the vertical axis in a downward direction; and the voltage on electrode 51 is presumed to be held constant at some convenient voltage $V_x$ (which typically equals $V_{dd}$).

FIG. 6a illustrates the surface potentials in a cell when a binary "1" is stored. In this state, storage region 74 is relatively free of electrons; and this causes the surface potential to rise in that region. At the same time, the voltage on transfer gate 41 is near ground; and this causes transfer region 77 to also have a surface potential near ground. The low surface potential of transfer region 77 permits the voltage on bit line b1 to swing between the logical "1" and "0" levels, (12 volts and 0 volts respectively for example) without causing electrons to flow into or out of storage region 74. These voltage levels on bit line b1 occur due to the reading and writing of other cells on the same bit line as was described earlier in conjunction with FIG. 2.

FIGS. 6b–6f illustrate the surface potentials that occur when a binary "0" is written into the cell. In FIG. 6b, the bit line is set to a "0" voltage level. At a later instant, the transfer gate voltage is raised to a high level (12 volts for example) via row line X0; and this causes the surface potential of transfer region 77 to rise as illustrated in FIG. 6c. The low voltage (0 volts for example) on bit line b1 causes electrons to flow through transfer region 77 into storage region 74. The presence of electrons in these regions causes the storage region surface potential to drop—as illustrated in FIG. 6d. After a very short time (nanoseconds), all transients die out, and the surface potentials in storage region 74, transfer region 77, and bit line b1 are approximately equal. FIG. 6e illustrates this latter condition. At still another time instant, the voltage on row line X0 is lowered to near ground, and this causes the voltage in transfer region 77 to drop. Therefore, the bit line voltage is again free to move between the "1" and "0" levels without affecting the potential of storage region 74. This condition is illustrated in FIG. 6f.

The reverse sequence is illustrated in FIGS. 7a–7f. That is, these figures show the surface potentials of storage region 74, transfer region 77, and bit line b1 for writing a binary "1" into the cell. FIG. 7a illustrates the initial surface potentials that are assumed to be present. At a later time instant, the bit line is forced to a "1" voltage—as illustrated in FIG. 7b. Then, the transfer gate voltage is raised to a high level which causes the surface potential of transfer region 77 to rise as illustrated in FIG. 7c. The high surface potentials of regions 73 and 74 cause electrons to flow out of storage region 74—as illustrated in FIG. 7d. Thus, the surface potentials of regions 73, 74 and 77 quickly equalize as illustrated in FIG. 7e. Then, the transfer gate voltage is lowered, and therefore the bit line voltage is free to move between the "1" and "0" levels without affecting the potential of storage region 74.

An important parameter of memory cell 30 indicates the quantity of charge that is stored in storage region 74. This parameter is called charge capacity per unit area, and for the Hi-C cell it is designated as $Q_{Hi-C}$. Physically, $Q_{Hi-C}$ depends on the quantity, type, and location of implants in the storage area, and also on the overlying electrode structure. But, on a macro level, charge capacity per unit area may also be expressed in terms of the oxide capacitance of the storage region and the storage gate voltage. (The effect of depletion capacitance is taken into account in the storage gate voltage term.) This relationship will now be derived for the Hi-C cell in order to show its high storage capacity.

Figure 8:
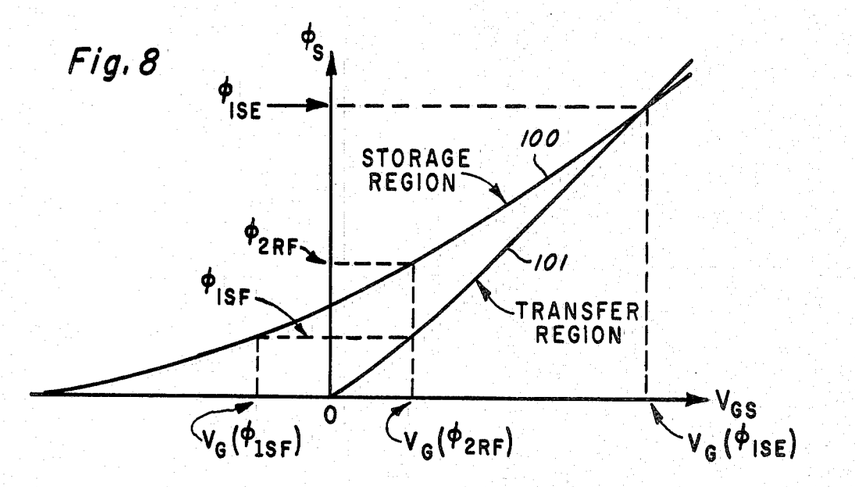
FIG. 8 is a plot of surface potential versus gate voltage for various regions of the cell of FIG. 4.

The development of an expression for $Q_{Hi-C}$ is best understood when made in reference to FIG. 8. This figure relates surface potential in the Hi-C cell to gate voltage. Curve 100 illustrates the relation between surface potential of storage region 74 and storage gate voltage; while curve 101 relates surface potential of transfer region 77 and transfer gate voltage.

It can be shown that the charge capacity of a memory cell equals the product of the oxide capacitance $C_o$ and a term $\Delta V_G$. The latter term equals the change in storage gate voltage required to shift the surface potential in the storage region from its empty-well value to its full-well value. This fact is documented in an article by A. F. Tasch, Jr. et al at pages 575–585 in the 1976 October issue of the IEEE Journal of Solid State Circuits. The empty-well value of surface potential in the storage region is represented in FIG. 8 as $\phi_{ISE}$, and the full-well value of surface potential is represented as $\phi_{ISF}$. Curve 100 relates these surface potentials to storage gate voltage. By using the information in curve 100, charge capacity per unit area can be expressed as $Q_{Hi\text{-}C} = C_o[V_G(\phi_{ISE}) - V_G(\phi_{ISF})]$.

It is useful to express this charge capacity in terms of the charge capacity of the conventional one-transistor cell or conventional charge coupled cell in order to compare the three devices. The charge capacity per unit area of the one-transistor cell, $Q_{I\text{-}T}$, is also defined as $[C_o] \cdot [\Delta V_G]$ where the latter term again equals the change in storage gate voltage required to shift the surface potential of the storage region from its empty-well value to its full-well value. The empty and full well values of surface potential are again $\phi_{ISE}$ and $\phi_{ISF}$ respectively. Curve 101 relates these surface potentials to the storage gate voltage of an I-T cell because the storage region curve of an I-T cell is the same as the transfer region curve of a Hi-C cell. Using the information in curve 101, the expression for $Q_{I\text{-}T}$ may be written as $Q_{I\text{-}T} = C_o[V_G(\phi_{ISE}) - V_G(\phi_{2RF})]$. Substitution of this expression into the expression for $Q_{Hi\text{-}C}$ gives $Q_{Hi\text{-}C} = Q_{I\text{-}T} + C_o[V_G(\phi_{2RF}) - V_G(\phi_{ISF})]$.

By similar analysis, an expression for charge capacity per unit area of the conventional charge-coupled cell $Q_{cc}$ may be derived. In a charge-coupled cell, the storage gate voltage and the transfer gate voltage are identical; and curves 100 and 101 relate these gate voltages to surface potentials of the storage and transfer region respectively. From FIG. 8, it is clear that when the storage gate (and transfer gate) voltage is at $V_G(\phi_{ISE})$, the surface potentials of the storage region and transfer region are equal. Therefore, no charge is stored in this state. On the other hand, when the storage gate (and transfer gate) voltage is at $V_G(\phi_{2RF})$, the surface potential in the storage region is more positive than the surface potential of the transfer region. The difference in surface potential is given by FIG. 8 as $\phi(2RF) - \phi(ISF)$. Thus, $\phi(2RF)$ and $\phi(ISF)$ are the empty and full well surface potentials respectively of the charge coupled cell.

Charge capacity $Q_{cc}$ of the charge coupled cell is $[C_o][\Delta V_G]$ where $\Delta V_G$ equals the change in storage gate voltage required to shift the surface potential of the storage region from its empty-well value to its full-well value. FIG. 8 relates the empty-well surface potential $\phi_{2RF}$ to a gate voltage of $V_G(\phi_{2RF})$ and relates full-well surface potential $\phi_{ISF}$ to $V_G(\phi_{ISF})$. Therefore, the expression for $Q_{cc}$ in terms of gate voltage is $Q_{cc} = C_o[V_G(\phi_{2RF}) - V_G(\phi_{ISF})]$. And substituting this expression into the previously derived expression for $Q_{Hi\text{-}C}$ gives $Q_{Hi\text{-}C} = Q_{cc} + Q_{I\text{-}T}$.

This is a very important and synergistic result. The equation says the charge capacity per unit area of a Hi-C cell equals the charge capacity per unit area of a conventional one-transistor cell plus the charge capacity per unit area of the conventional charge-coupled cell. This increased charge capacity, is made possible by the novel structure of the Hi-C cell. In particular, the unique combination of a storage region 74 having two overlying implants of different type, and an overlying electrode that is controlled independently of the transfer gate gives rise to the increased storage capacity.

Figure 9:
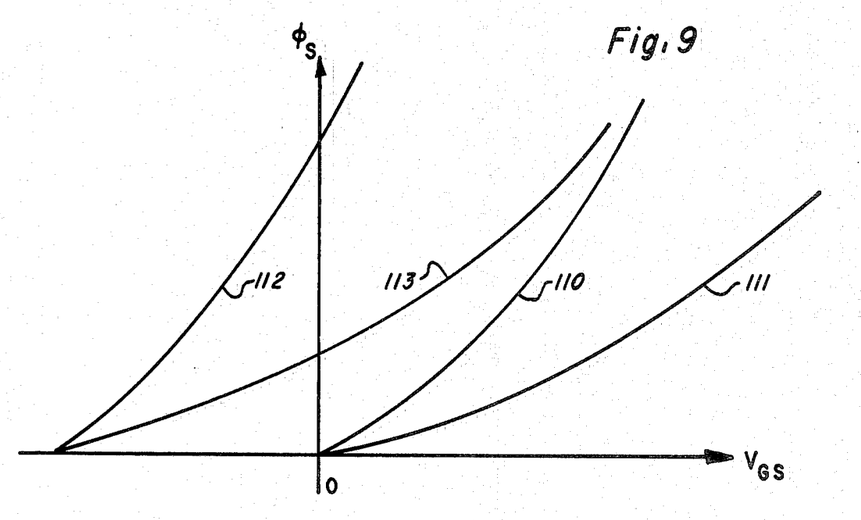
FIG. 9 is a plot of storage region surface potential versus gate voltage for several differently doped storage regions.

The manner in which $Q_{Hi\text{-}C}$ depends on the doping of storage region 74 is best understood by referring to FIG. 9. The curves in this figure relate surface potential to gate voltage of the storage region for various types of implants. Curve 110 illustrates the condition where no N-type dopant and no P-type dopant are added to the P-type substrate. In other words, curve 110 in FIG. 9 is identical to curve 101 of FIG. 8—which describes transfer region 77.

The effect of adding P-type implant 76 to storage region 74 is illustrated by curve 111 in FIG. 9. In general terms, implant 76 causes curve 111 to have less slope as compared to curve 110. As a specific example of the quantity of dopants involved, the substrate doping typically may be $10^{15}/cm^3$ whereas P implant 76 typically has an average concentration of $(1-8) \times 10^{16}/cm^3$. Similarly, the effect of adding a shallow N-type implant 75 is illustrated by curve 112 in FIG. 9. In general, the effect is to shift curve 110 to the left while leaving the slope unchanged. As an example of the quantity of dopant involved, N-implant 75 typically has a per unit area concentration of $1-6 \times 10^{12}$ ions/cm$^2$. By combining N-type implant 75 and P-type implant 76 in one region, a characteristic curve 113 results. The particular concentration of dopants can be varied to tailor curve 113 to meet a particular charge capacity requirement.

Surface potential versus gate voltage characteristics and the charge capacity per unit area of the CC, I-T, and Hi-C cells were measured on a number of slices, each having a different set of implant parameters. The results of these measured capacities for $V_{DD} = 12$ v, $V_{RW} = 11.5$ v, and $V_{BB} = -5$ v are shown in Table 1 below, along with the capacities which were predicted from the surface potential-gate voltage curves.

TABLE 1

PREDICTED AND MEASURED CHARGE CAPACITIES PER UNIT AREA

| BORON | | ARSENIC | | ONE-TRANSISTOR CELL | | CC RAM CELL* | | HI-C CELL* | |
|---|---|---|---|---|---|---|---|---|---|
| Implant Energy | Ions, per CM$^2$ $\times 10^{12}$ | Implant Energy | Ions per CM$^2$ $\times 10^{13}$ | Predicted Electrons/CM$^2$ | Measured Electrons/CM$^2$ | Predicted | Measured | Predicted | Measured |
| 115 Kev | 4.0 | 105 Kev | 2.2 | $2.48 \times 10^{12}$ | $2.35 \times 10^{12}$ | 0.17 | .27 | 1.17 | 1.22 |
| 135 Kev | 4.0 | 105 Kev | 2.8 | " | $2.32 \times 10^{12}$ | 0.48 | .48 | 1.48 | 1.45 |
| 135 Kev | 4.0 | 105 Kev | 3.2 | " | $2.43 \times 10^{12}$ | 0.45 | .48 | 1.45 | 1.48 |
| 115 Kev | 5.0 | 105 Kev | 3.0 | " | $2.43 \times 10^{12}$ | 0.43 | .55 | 1.43 | 1.49 |
| 115 Kev | 4.0 | 105 Kev | 2.7 | " | $2.36 \times 10^{12}$ | 0.39 | .44 | 1.39 | 1.38 |
| 115 Kev | 4.0 | 105 Kev | 3.0 | " | $2.45 \times 10^{12}$ | 0.35 | .44 | 1.35 | 1.45 |
| 115 Kev | 4.0 | 105 Kev | 3.2 | " | $2.39 \times 10^{12}$ | 0.35 | .41 | 1.35 | 1.38 |
| 115 Kev | 5.0 | 105 Kev | 3.2 | " | $2.39 \times 10^{12}$ | 0.45 | .58 | 1.45 | 1.56 |
| 135 Kev | 5.0 | 105 Kev | 3.0 | " | $2.36 \times 10^{12}$ | 0.44 | .56 | 1.44 | 1.49 |
| 135 Kev | 5.0 | 105 Kev | 2.7 | " | $2.35 \times 10^{12}$ | 0.48 | .53 | 1.48 | 1.49 |

$V_{BB} = -5v, V_{DD} = 12v$, and $V_{RW} = 11.5v$
*Normalized to the charge capacity of the one-transistor or double-level polysilicon cell (ratio as to quantity given for one-transistor cell).

There are three important points to note from this table. The data proves that indeed $Q_{Hi\text{-}C}$ does equal $Q_{cc}$ plus $Q_{I-T}$. Also, the data proves that charge capacity in a Hi-C cell is 45-55% higher than that of the I-T cell for a variety of implant concentrations and for $V_{bb}=-5$ v. And in addition, the relation $Q_{Hi-C}=Q_{cc}+Q_{I-T}$ holds true over a range of implant energies that can easily be met in a production environment.

Figure 10:
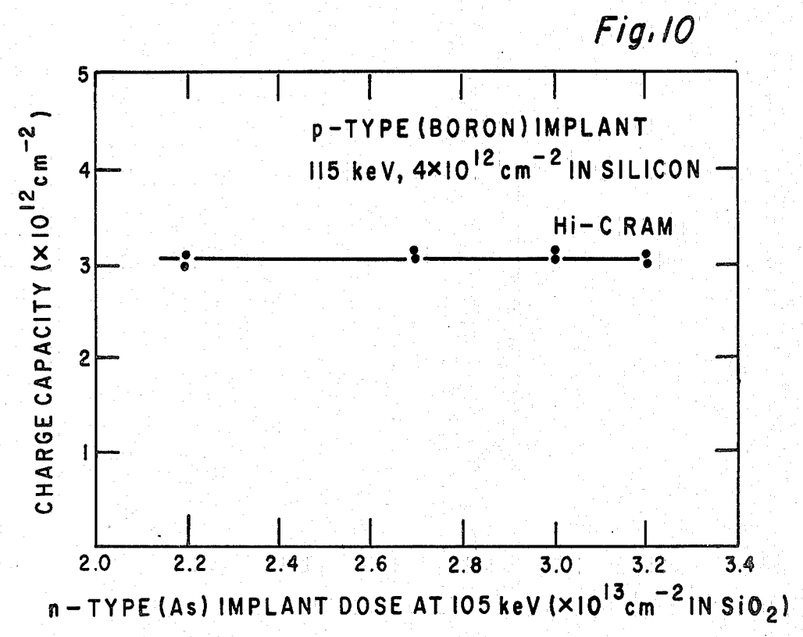
FIG. 10 is a plot of experimental data relating charge capacity in a Hi-C cell to the concentration of the shallow implant.

It is also of interest to plot how the charge capacity of the Hi-C cell varies as a function of the shallow implant concentration in the storage region. Experimental data relating these variables is given in FIG. 10. As illustrated in the figure, a deep P-type implant (boron) was made which had a fixed dose of $4\times10^{12}$ ions/cm$^2$. A shallow N-type implant dose (in the $SiO_2$) was varied from $2.2\times10^{13}$ ions/cm$^2$ to $3.2\times10^{13}$ ions/cm$^2$. This corresponds to a dose variation in the silicon of $2-5\times10^{12}$ ions/cm$^2$. The figure shows that the implant parameters (P and N) can be chosen so that $Q_{Hi-C}$ is maximized and quite insensitive to such a variation of the N-type implant. Thus, a production type tolerance on this implant concentration is non critical.

Figure 11:
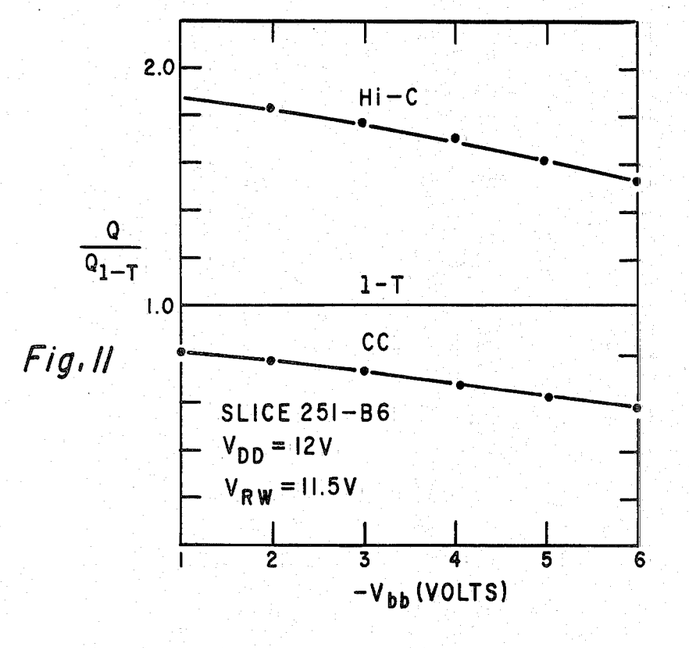
FIG. 11 is a plot of experimental data relating charge capacity to $V_{bb}$.

Also of interest is the manner in which $Q_{Hi-C}$ varies with respect to substrate bias. FIG. 11 illustrates experimental data relating $Q_{Hi-C}$ to $V_{bb}$. Also plotted are $Q_{I-T}$ and $Q_{cc}$ versus $V_{bb}$ for comparison. As illustrated in the figure, $Q_{Hi-C}$ increases with decreasing $V_{bb}$. This experimental result is in agreement with theory. The figure is also further experimental verification of the increased charge capacity per unit area of the Hi-C RAM cell. As therein illustrated, the increase in charge capacity, is most pronounced at low values of $V_{bb}$. In fact, if $V_{bb}$ is eliminated and the substrate is grounded, $Q_{Hi-C}$ can be 100% greater than $Q_{I-T}$.

Another important feature of the Hi-C cell is that it has lower leakage current than the conventional one-transistor cell. Typically, leakage current in the Hi-C cell is expected to be 3 to 8 times lower than leakage current in the I-T cell. One reason for this lower leakage is that P-type implant 76 under storage line 51 increases the substrate doping which decreases the width of the depletion region in substrate 70. As a result, less physical space exists in which electron-hole pairs may be thermally generated. These electron-hole pairs give rise to the leakage current. Thus by decreasing the space in which electron-hole pairs form, leakage current is also decreased. The net effect of having lower leakage current is that an empty potential well takes longer to drift toward the full-well level. Therefore, the cell needs to be refreshed less often, and this makes the cell easier to use in a memory system.

Another reason why the Hi-C cell has low leakage current is that the cell architecture creates a potential barrier around the perimeter of the storage region. And this potential barrier stops leakage current that is generated outside of the storage region from diffusing into the storage region. The deep P-implant gives rise to this potential barrier. When the deep implant is made, most of it will travel vertically into the substrate; but a portion of it will also travel laterally. This phenomena is known as lateral straggle. On the other hand, the shallow implant does not have much lateral straggle because of its low energy implant level and because arsenic and antimony are heavy mass ions. By using suitable implant steps, the straggle is designed to extend beyond the N-implant in the lateral direction around the perimeter of the storage region, except for the drain region. There, the P-type implant is kept inside of the N-type implant. And as previously pointed out in conjunction with FIG. 9, the effect of an implant of the same type as the substrate is to lower the surface potential in the implant region. Thus a potential barrier is created in the straggle area around the perimeter of the Hi-C cell except for the drain region. A potential well exists in the drain region.

Experimental data on initial devices also verifies that leakage current is less in the Hi-C cell than in the conventional I-T or DLP cell. Table 2 below illustrates this experimental data.

TABLE 2

| Cell | Leakage Current* |
|---|---|
| Conventional I-T Cell | 1.0 |
| Hi-C Cell | 0.3-.5 |

*Normalized to the I-T Cell.

Figure 12:
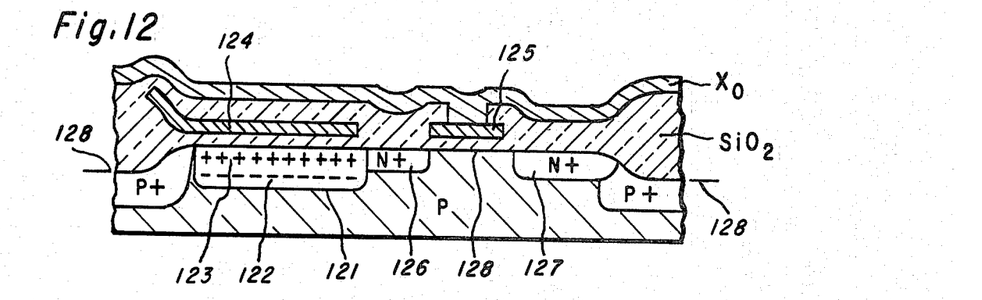
FIG. 12 is a greatly enlarged cross-sectional view of a second memory cell whose construction embodies the invention.

Referring now to FIG. 12, a second embodiment of the Hi-C cell is illustrated. This embodiment is similar in many respects to the previously described cell. For example, it includes a storage region 121 which has a deep P-type implant 122 and a shallow N-type implant 123. Implants 122 and 123 have distribution peaks and concentration dosages identical to those of the previously described deep implant 76 and shallow implant 75 respectively. This Hi-C cell also includes an overlying storage gate 124 and a transfer gate 125 which are separately operable from each other. However, the two cell embodiments differ from each other, in that the second embodiment includes an additional N+ type region 126 similar to the N+ region 127. Region 126 is adjacent to storage region 121 and is spaced apart from a source-bit line region 127. Also, transfer gate 125 does not overlie storage gate 124, but instead overlies the surface region between regions 126 and 127.

The electrical operation of the second embodiment is very similar to the electrical operation of the first embodiment. Storage region 121 and region 126 act like storage region 74; and the surface area under gate 125 acts like transfer region 77. With these modifications, the diagrams of FIGS. 6 and 7, which illustrate surface potentials of the storage region and transfer region, also describe the operation of the second embodiment. In addition, the surface potential versus gate voltage diagrams of FIGS. 8 and 9 also apply to the second embodiment. And since charge capacity per unit area depends on the shape of curves in FIG. 8, both embodiments have the same high capacity. The second embodiment will also have reduced leakage current, because storage region 121 has the same construction as the previously described storage region 74.

Figure 13:
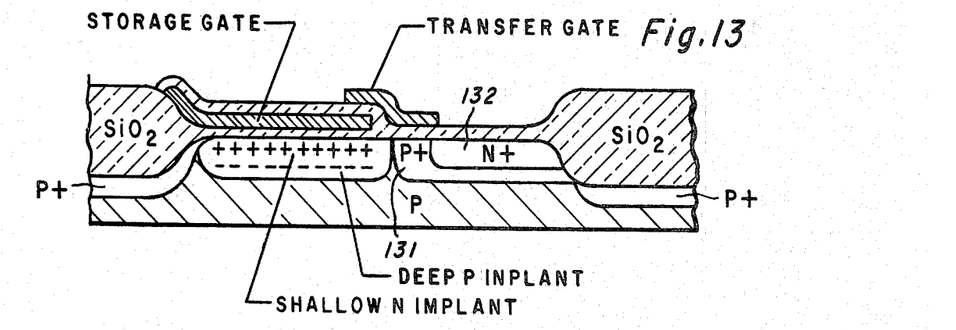
FIG. 13 is a greatly enlarged cross-sectional view of a third memory cell whose construction embodies the invention.

FIG. 13 is a greatly enlarged cross-sectional view of still another memory cell which is constructed according to the invention. This cell structure uses DMOS technology to yield a high density, high capacity cell having a very short channel in the transfer region 131. In accordance with DMOS technology, transfer region 131 is defined by a diffusion, rather than by lithography; and the source-bit line region is formed by a second diffusion 132 lying within this transfer region diffusion. This yields a channel length of approximately 1-2$\mu$. The remainder of the cell is constructed in a manner similar to that previously described in conjunction with FIG. 4.

Figure 14:
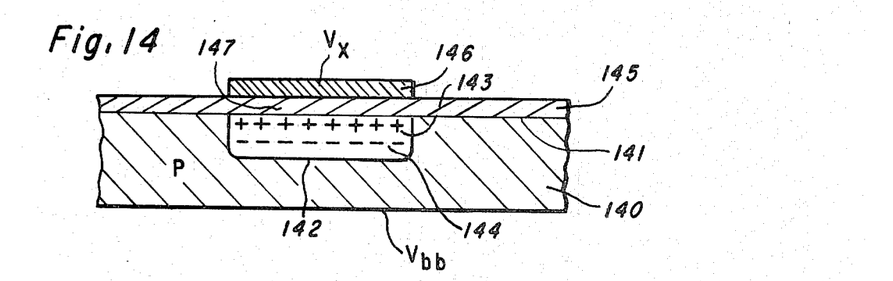
FIG. 14 is a greatly enlarged cross-sectional view of a high capacity capacitor whose construction embodies the invention.

Referring now to FIG. 14, a more fundamental embodiment of the invention is illustrated in an enlarged cross-sectional view. This embodiment is a high capacity dynamic MOS capacitor. It may be used in conjunction with other circuitry wherever a high capacitance is required. Electrical connection between the capacitor and the other circuitry may be made by adjacent diffused regions, by adjacent implanted regions, or by adjacent overlapping gates. As previously described, a memory having an array of storage cells is one such application.

The high capacity dynamic MOS capacitor of FIG. 14 is comprised of a P-type substrate 140 having a first surface 141. A storage region 142 lies within substrate 140 near surface 141. This storage region is comprised of an N-type implant 143 lying in the substrate near surface 141, and a P-type implant 144 lying beneath implant 143. An insulating layer 145 overlies surface 141. An independently operable electrode 146 overlies storage region 142, and voltage signals $V_x$ are applied to this electrode to bias region 142 with respect to the substrate voltage $V_{bb}$.

Figure 15A:
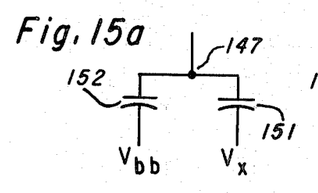
FIGS. 15a and 15b are respective D-C and A-C equivalent circuit diagrams of the structure of FIG. 14.
Figure 15B:
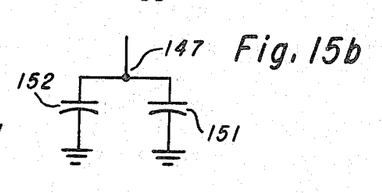

FIG. 15a is a D-C equivalent circuit diagram of the structure of FIG. 14, while FIG. 15b is an A-C equivalent circuit diagram of the same. These circuit diagrams illustrate the fact that the structure actually stores charge of node 147 in two capacitors—151 and 152. Capacitor 151 represents the oxide capacitance; while capacitor 152 represents the depletion capacitance. The former is physically due to the interaction of electrode 146 with surface 141, while the latter is physically due to the interaction of double implants 143 and 144. This phenomenon was previously described in conjunction with FIG. 3. The point is re-emphasized here, however, because of its importance in achieving the high capacitance, and because it is a phenomenon which has not been usefully employed by a practical structure in the past.

Various embodiments of the invention have now been described in detail. However, other changes and modifications can be made in the above details without departing from the nature and spirit of the invention. For example, while this description has generally referred to the substrate as P-type, and the storage region as having a deep P-type implant and a shallow N-type implant, these dopant types may be reversed. Also, semiconductor materials other than silicon, and insulating layers other than $SiO_2$ may be used.

In addition while this description has covered a 16K memory, other size memories—either larger or smaller—can incorporate the Hi-C cell. For example, memories having approximately 64,000; 128,000; 256,000; or 512,000 cells may be constructed on a single semiconductor substrate. These memories have an architecture similar to the one described in conjunction with FIG. 1. One primary difference is, of course, that more row and column lines must be added to the array pattern illustrated in FIG. 2. But, in addition, the physical size of the previously described memory cells of FIGS. 4, 12 and 13 is made smaller. These high density cells are as small as 0.04 mil$^2$. To achieve this small size requires that certain parameters of the cells be appropriately scaled. In particular, the gate oxide thickness is reduced to 300-500 Å. Also, the shallow implant in the storage region lies completely within 1000 Å from the semiconductor surface; and its concentration dosage is from $(3-9)10^{12}$ ions/cm$^2$. And the deep implant in the storage region has a Gaussian distribution peak of 1500-5000 Å from the semiconductor surface; and its concentration dosage is from $(0.7-4.0) \times 10^{13}$ ions/cm$^2$.

These parameters are chosen for several reasons. One reason is to avoid undesirable effects of lateral straggle. As the size of the high density cell decreases, the straggle dimensions become close to various dimensions of the cell itself. Thus, the depth of the deep implant is reduced to minimize excessive straggle. Accordingly, the shallow implant is made closer to the semiconductor surface in order to avoid compensation or cancellation with the deep implant. In addition, the concentration dosages of the deep and shallow implants are increased. These high concentrations further increase the depletion capacitance. This increased depletion capacitance partially compensates for the reduction in storage capacity that is due to the smaller surface area of the storage region. At the same time, the increased concentration dosages do not cause avalanche breakdown because the operating voltages of the cell are also scaled down. For example, $V_x$ may be only +5v, rather than the conventional +12v.

Since these and other changes can be made without departing from the nature of the invention, it is understood that the invention is not to be limited to said details except as set forth in the appended claims.

What is claimed is:

1. A memory system of the type having an array of memory cells selectively addressable by row and column lines, each of said memory cells of said array comprising:

a semiconductor substrate of one conductivity type material common to said cells, said substrate having a first surface;

a region of the other conductivity type in said substrate adjacent to said first surface for forming a bit line and a transistor source;

a storage region lying in said substrate adjacent to said first surface and spaced from said other conductivity type region, said storage region forming a transistor drain and including a shallow implant of the other conductivity type impurity lying in said substrate near said first surface, and a deep implant of said one conductivity type impurity having an impurity dopant concentration that is greater than the dopant concentration of said one conductivity type material of said substrate;

a transfer region in said substrate adjacent to said first surface and disposed between said other conductivity type region and said storage region, said transfer region being defined by a zone of said one conductivity type material having an impurity dopant concentration greater than the dopant concentration of said one conductivity type material of said substrate;

said other conductivity type region lying within said zone of said one conductivity type material;

a storage gate overlying said storage region in spaced alignment therewith;

a transfer gate partially overlying said storage gate and in spaced relation thereto, said transfer gate being separately operable from said storage gate and including a transfer gate portion overlying said transfer region in spaced alignment therewith; and a body of insulating material disposed on said first surface of said substrate and interposed between said storage region and said storage gate, and said transfer region and said transfer gate, respectively, and said insulating body also being interposed between said storage gate and said transfer gate.

2. A memory cell for a semiconductor memory device, comprising:

a semiconductor substrate of one conductivity type material, said substrate having a first surface;

a region of the other conductivity type in said substrate adjacent to said first surface for forming both a bit line and a transistor source;

a storage region lying in said substrate adjacent to said first surface and spaced from said other conductivity type region, said storage region forming a transistor drain and including a shallow implant of the other conductivity type impurity lying in said substrate near said first surface, and a deep implant of said one conductivity type impurity having an impurity dopant concentration that is greater than the dopant concentration of said one conductivity type material of said substrate;

a transfer region in said substrate adjacent to said first surface and disposed between said other conductivity type region and said storage region, said transfer region being defined by a zone of said one conductivity type material having an impurity dopant concentration greater than the dopant concentration of said one conductivity type material of said substrate;

said other conductivity type region lying within said zone of said one conductivity type material;

a storage gate overlying said storage region in spaced alignment therewith;

a transfer gate partially overlying said storage gate and in spaced relation thereto, said transfer gate being separately operable from said storage gate and including a transfer gate portion overlying said transfer region in spaced alignment therewith; and a body of insulating material disposed on said first surface of said substrate and interposed between said storage region and said storage gate, and said transfer region and said transfer gate, respectively, and said insulating body also being interposed between said storage gate and said transfer gate.

* * * * *